United States Patent
Rennie et al.

(10) Patent No.: US 7,402,487 B2
(45) Date of Patent: Jul. 22, 2008

(54) PROCESS FOR FABRICATING A SEMICONDUCTOR DEVICE HAVING DEEP TRENCH STRUCTURES

(75) Inventors: Michael Rennie, Mechanicsville, VA (US); Stephen Rusinko, Chester, VA (US)

(73) Assignee: Infineon Technologies Richmond, LP, Sandston, VA (US)

( * ) Notice: Subject to any disclaimer, the term of this patent is extended or adjusted under 35 U.S.C. 154(b) by 107 days.

(21) Appl. No.: 10/967,465

(22) Filed: Oct. 18, 2004

(65) Prior Publication Data

US 2006/0084222 A1    Apr. 20, 2006

(51) Int. Cl.
*H01L 21/8242* (2006.01)

(52) U.S. Cl. ............... 438/245; 438/388; 438/455; 438/473; 438/700; 257/E21.008; 257/E21.396; 257/E21.646; 257/E21.655

(58) Field of Classification Search ........... 438/386, 438/243, 455, 245, 388, 424, 435, FOR. 221, 438/FOR. 227, 696, 700, 471, 473, FOR. 128, 438/FOR. 131, FOR. 388, FOR. 100, 672, 438/675, 942, 641, 674, 149, 151, 197, 199, 438/239, FOR. 134, FOR. 144, FOR. 145, 438/FOR. 212, FOR. 389, FOR. 484; 257/E21.396, 257/E21.585, E21.65, E21.008, E21.35, E21.64, 257/E21.655

See application file for complete search history.

(56) References Cited

U.S. PATENT DOCUMENTS

| 4,579,621 | A | * | 4/1986 | Hine | 117/95 |
| 4,728,623 | A | * | 3/1988 | Lu et al. | 438/245 |
| 4,951,115 | A | * | 8/1990 | Harame et al. | 257/191 |
| 5,571,743 | A | * | 11/1996 | Henkels et al. | 438/241 |
| 5,698,891 | A | * | 12/1997 | Tomita et al. | 257/610 |
| 6,040,211 | A | * | 3/2000 | Schrems | 438/238 |
| 6,437,386 | B1 | * | 8/2002 | Hurst et al. | 257/301 |
| 2002/0174828 | A1 | * | 11/2002 | Vasat et al. | 117/90 |
| 2003/0134468 | A1 | * | 7/2003 | Wang et al. | 438/243 |
| 2005/0285179 | A1 | * | 12/2005 | Violette | 257/315 |

FOREIGN PATENT DOCUMENTS

JP    04-097519    *    3/1992

* cited by examiner

*Primary Examiner*—Fernando L. Toledo
*Assistant Examiner*—Quovaunda Jefferson
(74) *Attorney, Agent, or Firm*—Brinks Hofer Gilson & Lione

(57) ABSTRACT

A process for fabricating a semiconductor device having deep trench structures includes forming a first portion of the trench in a semiconductor substrate and a second portion of the trench in a selectively-formed upper layer. After etching the substrate to form the first portion of the trench, a protective layer is deposited over the inner surface of the trench in the semiconductor substrate and the upper layer is selectively formed on a principal surface of the semiconductor substrate. During formation of the upper layer, a wall surface is formed in the upper layer that is continuous with the wall surface of the trench in the semiconductor substrate. By forming a second portion of the trench in the selectively-formed upper layer, a deep trench is produced having a high aspect ratio and well defined geometric characteristics.

22 Claims, 4 Drawing Sheets

PROCESS FOR FABRICATING A SEMICONDUCTOR DEVICE HAVING DEEP TRENCH STRUCTURES

TECHNICAL FIELD

The present invention relates, generally, to semiconductor device fabrication and, more particularly, to the fabrication of trench structures in semiconductor substrates.

BACKGROUND

As the trend toward higher integration levels in semiconductor device fabrication continues, the use of trench structures in semiconductor substrates has increased. Trench structures are used for a variety of different device components, including vertically oriented transistors, isolation structures, such as shallow trench isolation (STI) structures, deep trench isolation (DTI) structures, capacitors, and the like. Accordingly, the etching of trench structures in a semiconductor substrate is an important part of the overall process of manufacturing many integrated circuit devices.

The fabrication of trench structures, and in particular deep trench structures, presents a number of process requirements requiring adequate process control. During trench formation, it is important to control the sidewall profile as the trench is formed in the substrate. For example, undercutting of the masking pattern used to define the trench opening can result in an undesirable widening of the trench near the substrate surface. Also, in the fabrication of deep trench structures, a reasonably high etch rate needs to be maintained in order to provide acceptable process throughput. Resist loading can become a problem when etching deep trench structures due to erosion of the resist during the etching process.

Related to maintaining a high etch rate is the ability to achieve a desired trench depth in the substrate. Many semiconductor integrated circuits require trenches have depths of, for example, 80 to 100 microns. In addition to being very deep, these trenches also have very small diameters leading to large aspect ratios. The formation of high aspect ratio trench structures requires that the masking layer used to define the trenches withstand the etch process conditions necessary to rapidly etch the trenches deep into the substrate. Mask erosion during etching can lead to undesirable narrowing of the trench and, in extreme cases, blocking of the bottom of the trench, which results in a trench that is not etched to the desired depth.

In the fabrication of dynamic-random-access-memory (DRAM) devices, deep trenches are typically formed for capacitor fabrication. The geometry of the capacitor trench is an important factor in the capacitance value of the capacitor in a DRAM memory cell. In particular, it is desired that the capacitor in each DRAM memory cell have a similar capacitance value, so that the DRAM memory array stores electrical charge uniformly across the array.

Given the increasing importance of trench fabrication for a variety of semiconductor applications, improved fabrication technology is necessary that will enable the reliable formation of deep trench structures having substantially uniform geometrical characteristics.

BRIEF SUMMARY

In accordance with one embodiment of the invention, a process for fabricating a semiconductor device includes providing a semiconductor substrate having a principal surface. A first portion of a trench is formed in the principal surface of the semiconductor substrate. An inner surface of the first portion of the trench is covered with an insulating layer, and a second portion of the trench is formed by selectively forming a layer on the principal surface of the substrate.

In another embodiment of the invention, a process for fabricating a dynamic-random-access-memory device includes providing a substrate having a substrate surface. A first portion of a capacitor trench is formed that extends into the substrate in a first direction. A layer is selectively formed on the substrate surface, such that a second portion of the capacitor trench extends away from the substrate surface in a second direction. The second direction is substantially opposite to the first direction.

In yet another embodiment of the invention, a process for fabricating a semiconductor device includes providing a semiconductor substrate having a principal surface. A first portion of a wall surface is formed in the semiconductor substrate and covered with an insulating material. A layer is formed overlying the principal surface, while simultaneously forming a second portion of the wall surface in the layer.

In still another embodiment of the invention, a process for fabricating a semiconductor device includes providing a semiconductor substrate and etching the semiconductor substrate to form a trench having sidewalls and a bottom surface. A liner is formed in the trench overlying the sidewalls and bottom surface. An upper layer is selectively formed on the semiconductor substrate, where the upper layer includes sidewalls substantially continuous with the sidewalls of the trench.

Figure 1:
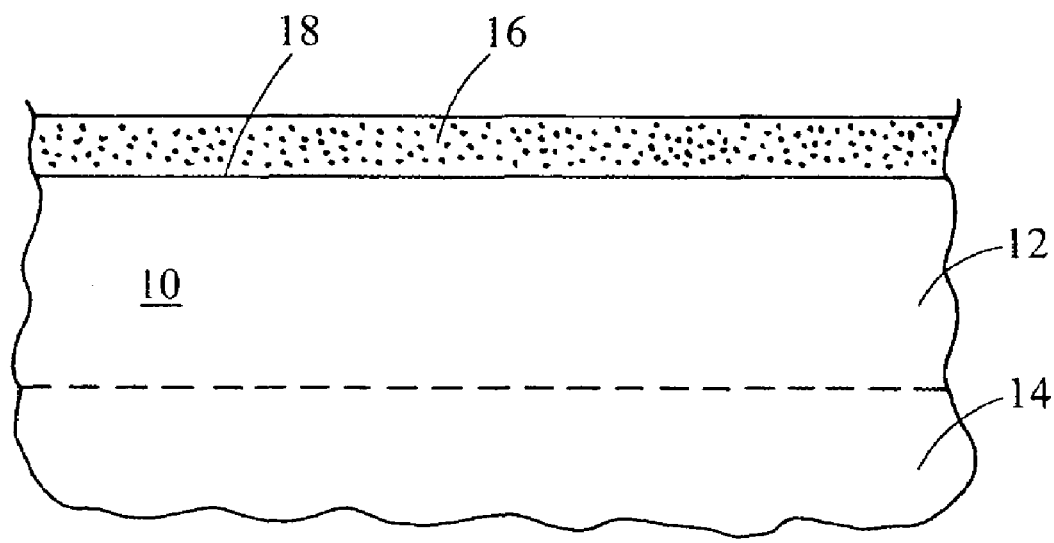
FIGS. 1-7 illustrate, in cross-section, processing steps in accordance with one embodiment of the invention.

It will be appreciated that for simplicity and clarity of illustration, not all the elements of a semiconductor device are illustrated in the Figures. Additionally, the elements illustrated in the Figures are not necessarily drawn to scale, for example, some elements are exaggerated relative to others. Further, where deemed appropriate, reference numerals have been repeated among the Figures to illustrate corresponding elements.

DETAILED DESCRIPTION

The present embodiment will be described with reference to the formation of deep trench structures for fabrication of DRAM capacitors. Accordingly, the semiconductor substrate will be described with reference to particular characteristics commonly employed in the fabrication of DRAM memory cells. The invention, however, is not limited to the fabrication of DRAM capacitors, and can be used for the formation of deep trench structures in the fabrication of a variety of semiconductor devices.

Shown in FIG. 1, and cross-section, is a portion of a semiconductor substrate 10 having a denuded zone 12 overlying a doped region 14. Doped region 14 is formed by heavily doping semiconductor substrate 10 with a conductivity-determining dopant species. In the exemplary embodiment of the invention set forth herein, doped region 14 is an n+ doped region formed by doping semiconductor substrate 10 with an n-type dopant, such as phosphorus or arsenic, or the like. Those skilled in the art will appreciate, however, that the exemplary embodiment set forth herein can be fabricated in a number of different semiconductor substrates having regions of varying conductivity.

Denuded zone 12 overlies doped region 14 and is formed to a depth sufficient to allow fabrication of trench structures extending within the bounds of denuded zone 12. Denuded zone 12 can be formed by a number of different techniques including gettering, abrasion, precipitation, laser rastering, and the like. The formation of denuded zone 12 to a depth below the maximum depth of the trenches to be formed in semiconductor substrate 10 reduces electrical leakage between adjacent capacitors in the DRAM cell being fabricated. In a preferred embodiment, doped region 14 is heavily doped with an n-type dopant to provide good capacitor plate characteristics and a uniform potential across the trench capacitors in the DRAM memory cell.

In accordance with one embodiment of the invention, the formation of deep trench structures commences with the formation of a resist layer 16 overlying a principal surface 18 of semiconductor substrate 10. Resist layer 16 can be any of a number of different resist materials, including photo resist, deep-UV resist, composite resist materials, x-ray materials, and the like. Resist layer 16 is deposited to a thickness sufficient to provide an adequate mask layer for the subsequent formation of trench denuded zone 12.

Figure 2:
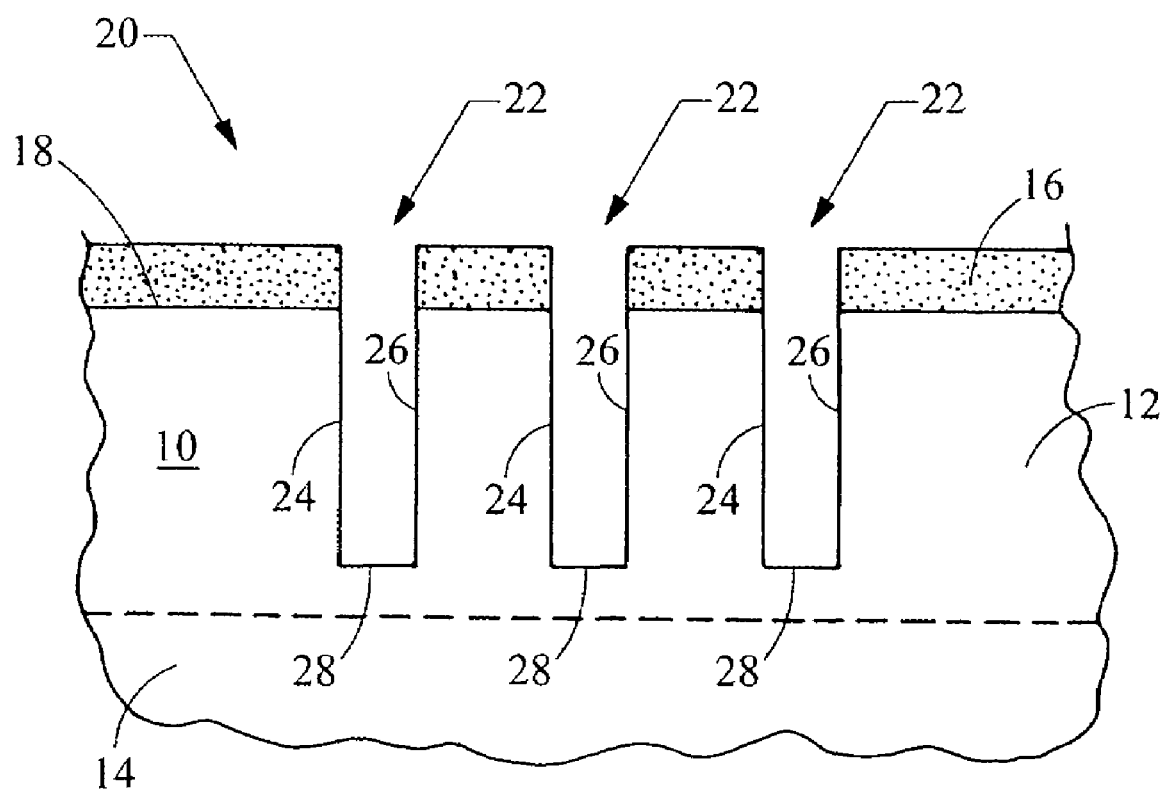
Figure 3:
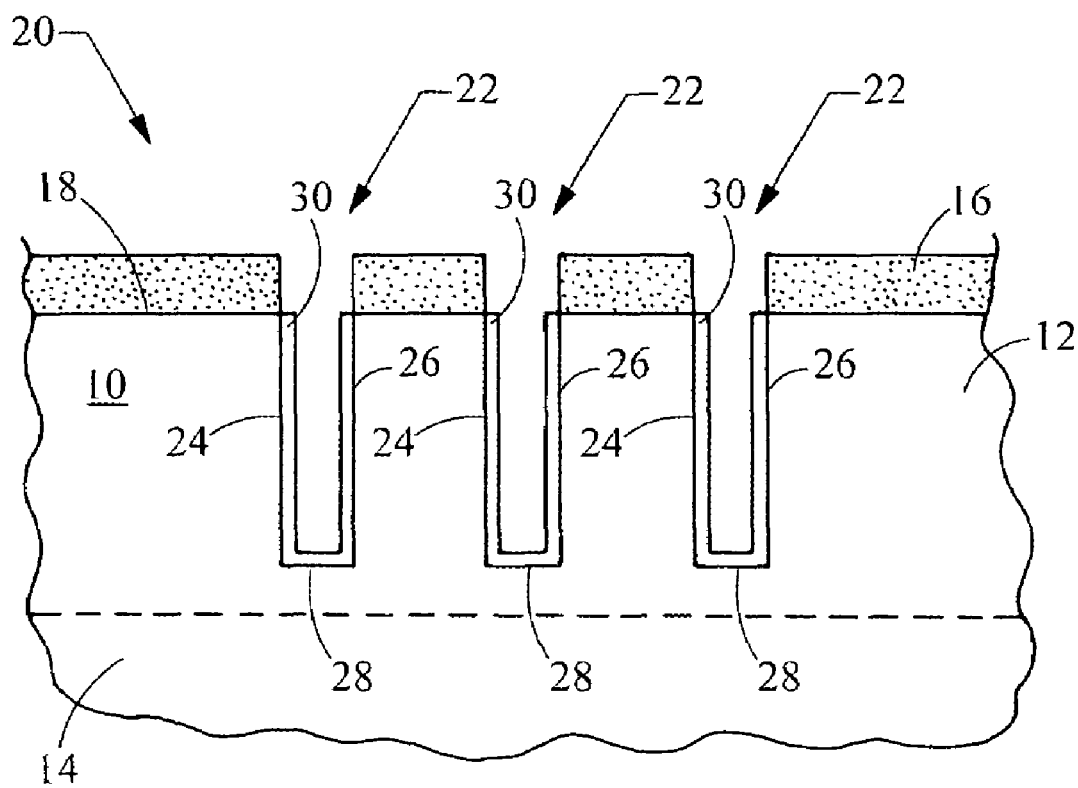

After forming resist layer 16, exposure and development processes are carried out to form a masking pattern 20 on principal surface 18 of semiconductor substrate 10, as illustrated in FIG. 2. Masking pattern 20 includes a series of openings 22 that expose underlying portions of principal surface 18. Once masking pattern 20 is formed, an etching process is carried out to form trench structures 24 in semiconductor substrate 10. Each of trench structures 24 includes wall surfaces 26 and bottom surfaces 28. The etching process is carried out for a sufficient length of time to etch trench structures 24 to a considerable depth within semiconductor substrate 10.

In the illustrated embodiment, where the inventive trench formation process is used for the fabrication of DRAM devices, bottom surfaces 28 reside in denuded zone 12. By forming bottom surfaces 28 within denuded zone 12, the entire outer surface of trench structures 24 resides within denuded zone 12, such that the trench capacitors to be subsequently formed in trench structures 24 will reside within denuded zone 12. In accordance with the illustrated embodiment, wall surfaces 26 are formed by anisotropically etching semiconductor substrate 10, such that wall surfaces 26 are substantially continuous, vertically oriented surfaces with respect to principal surface 18. Further, trench structures 24 are formed to have a lateral dimension substantially the same as that of openings 22. Accordingly, the etch fabrication process illustrated in FIG. 2 forms trenches that have a desired geometrical configuration and that have lateral dimensions that are substantially defined by the dimensions of openings 22 in mask pattern 20.

Following the formation of trench structures 24, a liner layer 30 is formed overlying wall surfaces 26 and bottom surfaces 28 of trench structures 24. Liner layer 30 is preferably formed by a conformal deposition process, such that a substantially uniform thickness of the liner material is formed overlying wall surfaces 26 and bottom surfaces 28. In accordance with one embodiment of the invention, liner layer 30 is a dielectric material that is differentially etchable with respect to the material of mask layer 16. For example, where mask layer 16 is a dielectric material, such as silicon nitride, liner layer 30 can be a silicon oxide material. Correspondingly, where mask layer 16 is silicon oxide, liner layer 30 can be silicon nitride. Those skilled in the art will appreciate that other combinations are possible, so long as one material is reactive with a particular etching chemistry while the other material is substantially unreactive with the same etching chemistry. Accordingly, liner layer 30 can be a thermally grown silicon oxide, a deposited silicon nitride, a composite material, such as an oxynitride formed by thermal oxidation followed by silicon nitride deposition, or by silicon oxide deposition followed by silicon nitride deposition, and combinations thereof.

Figure 4:
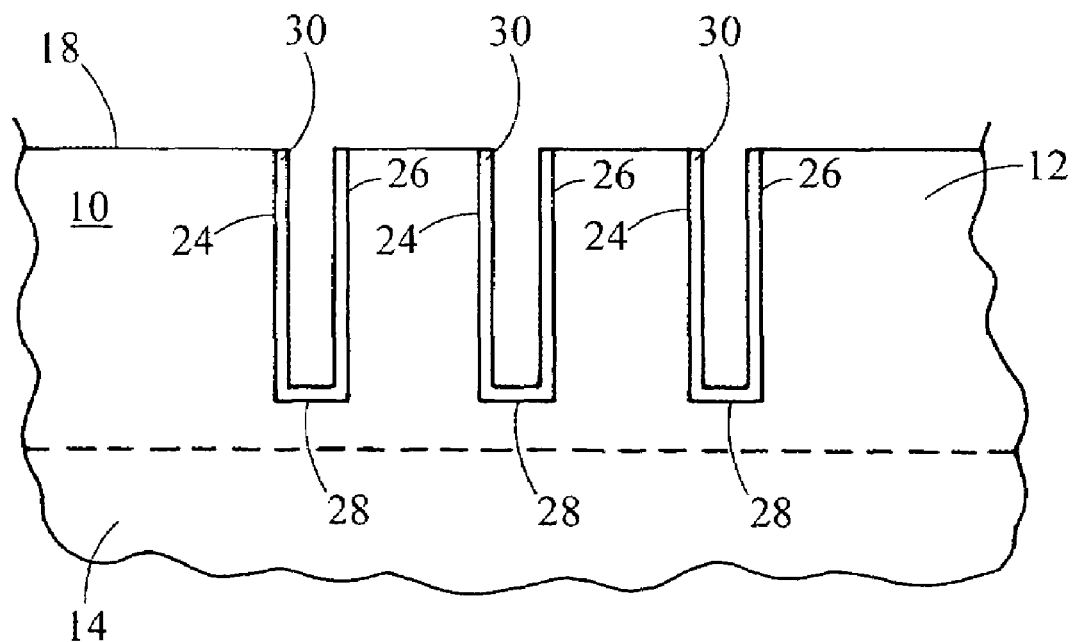

Once liner layer 30 is formed, masking pattern 20 is removed, as illustrated in FIG. 4. The removal of masking pattern 20 once again exposes principal surface 18 of semiconductor substrate 10. The removal process entirely removes mask layer 16, such that no residual portions of mask layer 16 remain on principal surface 18. In one embodiment, where mask layer 16 is silicon nitride and liner layer 30 is silicon oxide, a wet etching process including, for example, hot phosphoric acid can be used to remove masking layer 16. Those skilled in the art will appreciate that many different etching and stripping processes can be used to remove mask layer 16. For example, dry etching techniques, such as plasma etching, sputter etching, and the like can be used. Further, planarization techniques, such as chemical-mechanical-polishing (CMP) can also be used to remove mask layer 16 from principal surface 18.

Figure 5:
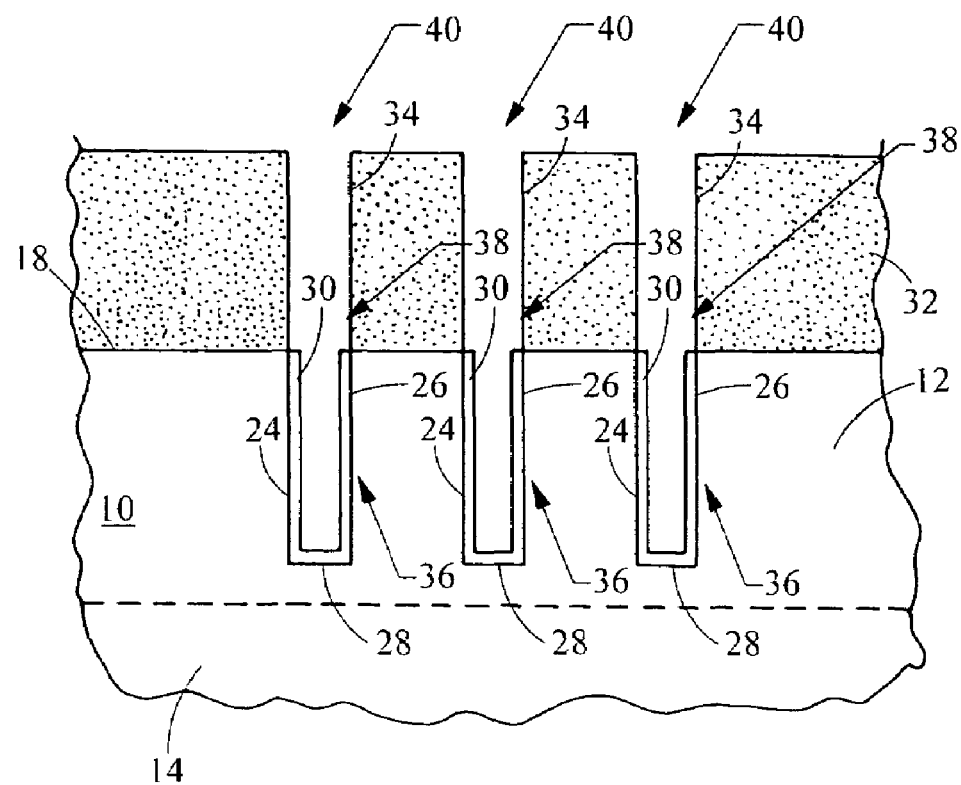

The inventive process continues as illustrated in FIG. 5 with the formation of an upper layer 32 overlying principal surface 18 of semiconductor substrate 10. Upper layer 32 is formed, such that wall surfaces 26 of trench structures 24 are continuous within upper layer 32. Accordingly, upper layer 32 includes wall surfaces 34 that extend from principal surface 14 in a substantially continuous plane with wall surfaces 26. By forming upper layer 32 to have continuous wall surfaces with trench structures 24, the effective depth of trench structures 24 is increased by the thickness of upper layer 32. Accordingly, once upper layer 32 is formed, trench structures 24 include first portions 36 and second portions 38. By forming second portions 38 in upper layer 32, a plurality of high-aspect ratio trenches 40 have first portions 36 residing in semiconductor substrate 10 and second portions 38 residing in upper layer 32.

In accordance with one embodiment of the invention, upper layer 32 is formed by a selective deposition process. In this selective deposition process, the crystalline semiconductor structure of principal surface 18 is used as a nucleation site to initiate the formation of a material layer having a crystalline structure similar to that of principal surface 18. As the deposition progresses, subsequent layers of material are sequentially formed having a substantially similar crystalline structure. The selective deposition process is continued until a desired thickness of material is formed on principal surface 18. Although the selective deposition process can be carried out to form a layer having a very large thickness, in the illustrated embodiment, the selective deposition process is limited to a thickness that yields trenches 40 having a maximum depth that will allow the formation of a trench capacitor within trenches 40.

Those skilled in the art will appreciate that various process technology exists for selectively depositing a semiconductor material. In one embodiment of the invention, upper layer 32 is formed by epitaxial deposition. In the epitaxial deposition process, silicon is re-grown on principal surface 18. In the epitaxial deposition process, a slight tilt may occur in second portion 38 with respect to first portion 36. The tilt is due to the growth along a specific crystalline plane of principal surface 18. Although a slight tilt can occur during the epitaxial deposition process, wall surface 34 in upper layer 32 is substantially continuous with wall surface 26 in substrate 10.

For the fabrication of a DRAM trench capacitor, upper layer 32 is doped with a conductivity determining dopant during the epitaxial deposition process. In one embodiment of the invention, upper layer 32 is doped to have a conductivity opposite to that of semiconductor substrate 10. Accordingly, where semiconductor substrate 10 is an n-type crystalline semiconductor material, upper layer 32 is doped with a p-type dopant, such as boron, to have a p-type conductivity. In the exemplary embodiment of the invention for the fabrication of a DRAM trench capacitor, doping upper layer 32 to have a p-type conductivity increases the vertical parasitic threshold voltage along the vertical length of trenches 40.

Figure 6:
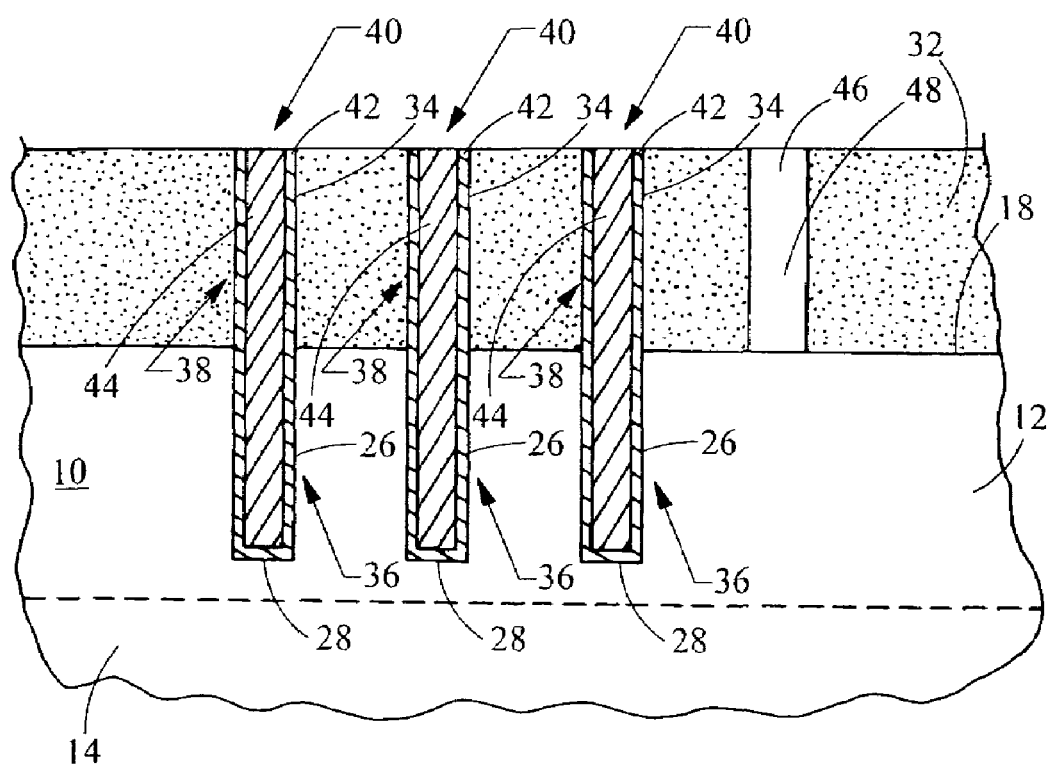

After forming upper layer 32, liner layer 26 is removed and a trench capacitor is formed in trenches 40, as illustrated in FIG. 6. In one embodiment of the invention, after removing liner layer 30, an oxidation process is carried out to anneal wall surfaces 26 and 34. In the embodiment of the invention where semiconductor substrate 10 and upper layer 32 are silicon-based materials, the thermal oxidation process forms a layer of silicon oxide overlying wall surfaces 26 and 34 and bottom surfaces 28. Following the oxidation process, the thermally grown silicon oxide is removed by wet etching, or other isotropic etching means, such as isotropic plasma etching, and a capacitor dielectric layer 42 is formed in trenches 40. Those skilled in the art will appreciate that a number of dielectric materials can be used to form a capacitor dielectric for a DRAM memory device. Accordingly, capacitor dielectric 42 can be a thermally grown dielectric material, a dielectric material formed by chemical-vapor-deposition (CVD), a high-capacitance dielectric material, a ceramic dielectric material, and the like.

After forming capacitor dielectric 42, trenches 40 are filled with a capacitor plate material 44. Capacitor plate material 44 can be one of a number of conductive materials used in semiconductor processing. For example, capacitor plate material 44 can be polycrystalline silicon deposited by CVD in such a manner as to completely fill trenches 40 with polycrystalline silicon. Where polycrystalline silicon is used to fill trenches 40, the polycrystalline silicon is doped with a conductivity determining dopant. By doping the polycrystalline silicon, the electrical conductivity of the polycrystalline silicon is enhanced. In one embodiment of the invention, the polycrystalline silicon is doped to have an n type conductivity with an n-type dopant, such as arsenic or phosphorus, or the like. In addition to polycrystalline silicon, other materials such as combinations of refractory metals and polycrystalline silicon, and other conductive materials can be used to fill trenches 40.

Once trench capacitors are fabricated, an electrical contact 46 is formed in upper layer 32. Electrical contact 46 can be formed by a number of known contact processes. In one embodiment of the invention, a lithographic masking and ion implantation process is carried out to form a doped channel through upper layer 32. Once the doping process is complete, electrical contact 46 includes a heavily doped region 48 in upper layer 32 that extends from the upper surface of upper layer 32 to principal surface 18 of semiconductor substrate 10.

Following the formation of electrical contact 46, transistors 50 and 52 are formed in upper layer 32. Transistors 50 and 52 each include gate electrodes 54 overlying upper layer 32 and separated therefrom by gate dielectric layers 56. Source and drain regions 58 and 60 reside in upper layer 32 on either side of gate electrodes 54. Drain regions 60 of transistors 50 and 52 are directly connected to capacitor plate material 44, while source regions 58 of transistors 50 and 52 are electrically isolated from capacitor plate material 44. At the time that source and drain regions 58 and 60 are formed, a doped contact region 64 is formed in electrical contact 46 in the upper portion of upper layer 32.

After forming transistors 50 and 52, an insulating layer 66 is formed to overlie upper layer 32. A lithographic patterning and etching process is carried out to form contact openings in insulating layer 66 and metal leads 68 and 70 are formed contacting source regions 58 and contact region 64, respectively.

Figure 7:
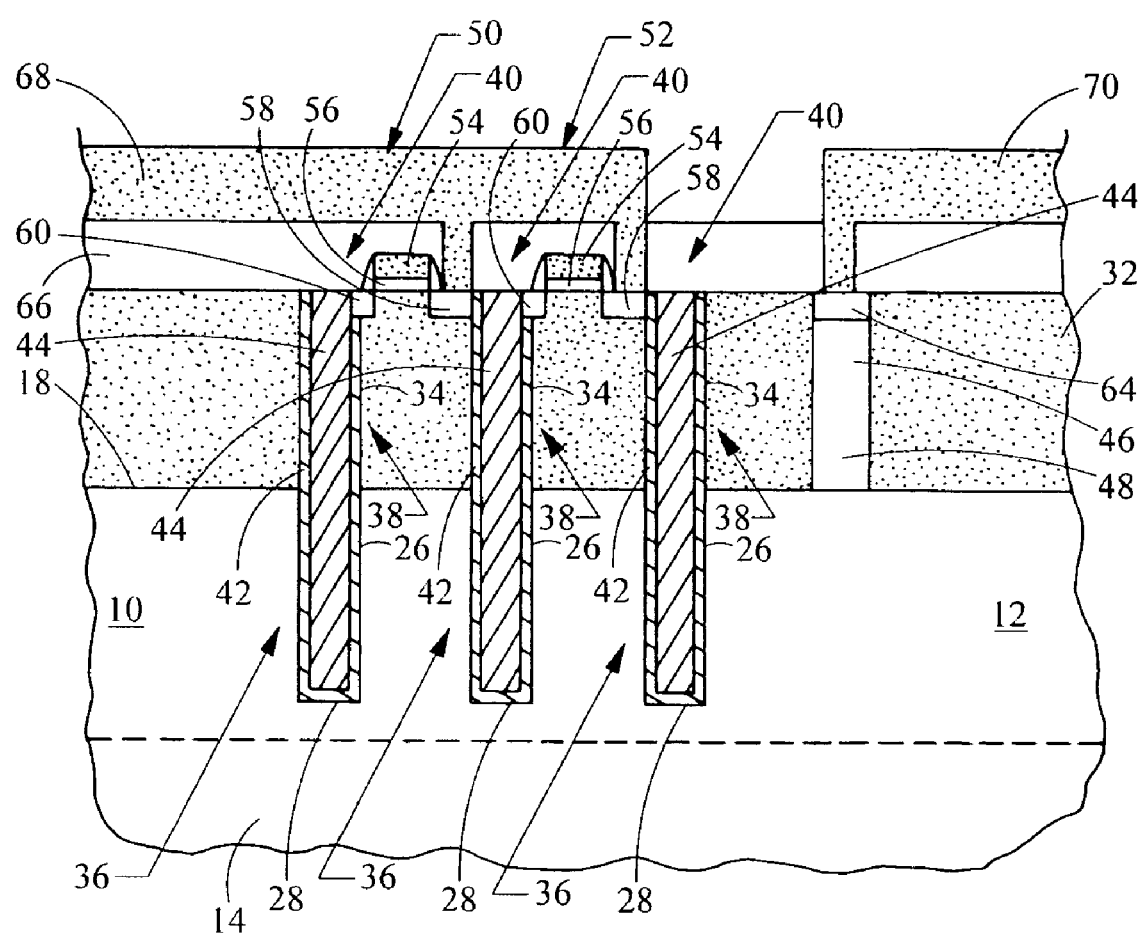

Those skilled in the art will recognize the structure illustrated in FIG. 7 as depicting the functional components of a DRAM memory cell. Metallization 70 provides a ground connection through electrical contact 46. Metallization 68 provides a bit line connection to source regions 58 of transistors 50 and 52. The drain regions 60 of transistors 50 and 52 are connected to one plate of the capacitors formed in trenches 40. Denuded zone 12 form a capacitor plate opposite capacitor dielectric 42 from capacitor plate material 44. Denuded zone 12 is electrically coupled through doped region 44 to ground metallization 70. Other metallization (not shown) forms a word line connection to gate electrodes 54 of transistors 50 and 52. Accordingly, in the illustrated embodiment, the inventive process has been carried out to form trench capacitors in a DRAM memory cell that have high aspect ratios and well-defined geometric characteristics. The particular doping characteristics described in the illustrated embodiment result in trench capacitors that have reduced parasitic degradation. Further, the inventive trench fabrication process produces high aspect ratio trenches having improved geometrical characteristics that can uniformly store electrical charge across a DRAM memory array.

Thus, it is apparent that there has been described, in accordance with the invention, a process for fabricating a semiconductor device having deep trench structures that fully provides the advantages set forth above. Those skilled in the art will recognize that numerous modifications and variations can be made without departing from the spirit and scope of the invention. For example, various processing methods can be used to form the various material layers and various etching processes can be used to pattern the material layers. Accordingly, all such variations and modifications are intended to be included within the scope of the appended claims and equivalents thereof.

It is therefore intended that the foregoing detailed description be regarded as illustrative rather than limiting, and that it be understood that it is the following claims, including all equivalents, that are intended to define the spirit and scope of this invention.

The invention claimed is:

1. A process for fabricating a semiconductor device comprising:
   a first stage comprising:
      providing a semiconductor substrate having a principal surface;
      forming a first portion of a trench in the principal surface of the semiconductor substrate using a masking pattern;
      covering an inner surface of the first portion of the trench with an insulating layer that is differently etchable with respect to a material of the masking pattern; and
      selectively removing the masking pattern with respect to the insulating layer in an etch step such that no residual portion of the masking pattern remains on the principle surface; and
   a second stage performed after the first stage, the second stage comprising:
      forming a second portion of the trench by selective epitaxial deposition of an upper layer of a semiconductor material on the principle surface of the semiconductor substrate, the layer of semiconductor material comprising a similar crystalline structure as the semiconductor substrate, wherein all surfaces of the trench are continuous within the upper layer and wherein the upper layer increases the effective depth of the trench.

2. The process of claim 1, wherein forming a first portion of the trench comprises forming an etch mask on the principal surface and etching the substrate.

3. The process of claim 1, wherein providing a semiconductor substrate comprises providing a semiconductor material of a first conductivity type and wherein forming an upper layer comprises forming a semiconductor material of a second conductivity type.

4. The process of claim 1, further comprising:
annealing the semiconductor substrate;
forming a capacitor dielectric on inner surfaces of the first and second portions of the trench; and
filing the first and second portions of the trench with a trench fill material.

5. The process of claim 4, wherein filing the first and second portions of the trench with a trench fill material comprises depositing a semiconductor material.

6. The process of claim 5, wherein depositing a semiconductor material comprises depositing polycrystalline silicon.

7. The process of claim 1, wherein covering an inner surface of the first portion of the trench with an insulating layer comprises forming a silicon oxide layer.

8. The process of claim 1, wherein covering an inner surface of the first portion of the trench with an insulating layer comprises forming a silicon nitride layer.

9. A process for fabricating a dynamic-random-access-memory device comprising:
a first stage comprising:
providing a substrate having a substrate surface; and
forming a first portion of a capacitor trench extending into the substrate in a first direction; and
a second stage performed after the first stage, the second stage comprising:
selectively depositing, by epitaxial deposition, an upper layer on the substrate surface, such that a second portion of the capacitor trench is formed extending away from the substrate surface in a second direction, wherein the second direction is substantially opposite to the first direction, wherein all surfaces of the trench are continuous within the upper layer, and wherein the upper layer increases the effective depth of the trench.

10. The process of claim 9 further comprising:
covering an inner surface of the first portion of the capacitor trench with an insulating layer before selectively forming the upper layer on the substrate surface.

11. The process of claim 9 further comprising:
forming a capacitor dielectric layer overlying sidewalls of the first and second portions of the capacitor trench, and
filling the capacitor trench with a capacitor plate material.

12. The process of claim 9, wherein providing a semiconductor substrate comprises providing a semiconductor material having a denuded zone overlying a doped region of a first conductivity type, and wherein selectively forming an upper layer comprises forming a semiconductor material of a second conductivity type.

13. A process for fabricating a semiconductor device comprising:
a first stage comprising:
providing a semiconductor substrate having a principal surface;
forming a first portion of a wall surface in the semiconductor substrate using a masking pattern;
covering the first portion of a wall surface with an insulating material that is differently etchable with respect to a material of the masking pattern; and
selectively removing the masking pattern with respect to the insulating layer in an etch step such that no residual portion of the masking pattern remains on the principle surface; and
a second stage performed after the first stage, the second stage comprising:
depositing, by epitaxial deposition, an upper layer overlying the principal surface while simultaneously forming a second portion of the wall surface in the upper layer, wherein the first portion of the wall surface is continuous with the second portion of the wall surface within the upper layer and wherein the upper layer increases the length of the first and second portions of the wall surface.

14. The process of claim 13, wherein covering the first portion of a wall surface with an insulating material comprises oxidizing the wall surface.

15. The process of claim 13, wherein providing a substrate comprises providing a semiconductor material of a first conductivity type and wherein forming a layer overlying the principle surface comprises forming a semiconductor material of a second conductivity type.

16. A process for fabricating a semiconductor device comprising:
a first stage comprising:
providing a semiconductor substrate and etching the semiconductor substrate to form a trench having sidewalls and a bottom surface; and
forming a liner in the trench overlying the sidewalls and the bottom surface; and
a second stage performed after the first stage, the second stage comprising:
selectively depositing, by epitaxial deposition, an upper layer of a semiconductor material on the semiconductor substrate, wherein the layer of semiconductor material comprises a similar crystalline structure as the semiconductor substrate, wherein the upper layer includes sidewalls continuous with the sidewalls of the trench, and wherein the upper layer increases the effective depth of the trench.

17. The process of claim 16, wherein providing a semiconductor substrate comprises providing a semiconductor substrate having a denuded zone overlying a doped region.

18. The process of claim 16, wherein etching the semiconductor substrate to form a trench comprises forming the bottom surface in the denuded zone.

19. The process of claim 16 wherein forming an upper layer comprises extending the trench above the semiconductor substrate.

20. The process of claim 19 further comprising:
forming a capacitor dielectric on the sidewalls and the bottom surface of the trench and the sidewalls of the upper layer; and
filling the trench with a capacitor plate material.

21. The process of claim 20, wherein filling the trench with a capacitor plate material comprises filling the trench with polycrystalline silicon.

22. The process of claim 16 further comprising:
forming an etch mask on the semiconductor substrate, wherein etching the semiconductor substrate to form a trench comprises etching the using the etch mask; and
removing the etch mask after forming the liner and prior to forming an upper layer on the semiconductor substrate.

* * * * *